United States Patent
Wang et al.

(10) Patent No.: US 10,490,583 B2
(45) Date of Patent: Nov. 26, 2019

(54) PACKAGING STRUCTURE AND PACKAGING METHOD

(71) Applicant: China Wafer Level CSP Co., Ltd., Suzhou, Jiangsu (CN)

(72) Inventors: Zhiqi Wang, Suzhou (CN); Fangyuan Hong, Jiangsu (CN)

(73) Assignee: China Wafer Level CSP Co., Ltd., Suzhou, Jiangsu (CN)

( * ) Notice: Subject to any disclaimer, the term of this patent is extended or adjusted under 35 U.S.C. 154(b) by 13 days.

(21) Appl. No.: 15/748,651

(22) PCT Filed: Aug. 5, 2016

(86) PCT No.: PCT/CN2016/093569
§ 371 (c)(1),
(2) Date: Jan. 29, 2018

(87) PCT Pub. No.: WO2017/024994
PCT Pub. Date: Feb. 16, 2017

(65) Prior Publication Data
US 2019/0006404 A1    Jan. 3, 2019

(30) Foreign Application Priority Data

Aug. 13, 2015  (CN) .......................... 2015 1 04986625
Aug. 13, 2015  (CN) ...................... 2015 2 0608933 U

(51) Int. Cl.
*H01L 27/146* (2006.01)
*H01L 23/00* (2006.01)

(52) U.S. Cl.
CPC ........ *H01L 27/14618* (2013.01); *H01L 24/11* (2013.01); *H01L 27/146* (2013.01);
(Continued)

(58) Field of Classification Search
CPC ......... H01L 2924/14; H01L 2224/0401; H01L 2924/0002; H01L 2224/05567;
(Continued)

(56) References Cited

U.S. PATENT DOCUMENTS

2006/0023108 A1   2/2006  Watanabe et al.
2009/0194154 A1   8/2009  Takahashi et al.
(Continued)

FOREIGN PATENT DOCUMENTS

CN       1728396 A     2/2006
CN     102138215 A     7/2011
(Continued)

OTHER PUBLICATIONS

Taiwanese Office Communication for Application No. 105125153 dated Jun. 13, 2017.
(Continued)

*Primary Examiner* — Caleen O Sullivan
(74) *Attorney, Agent, or Firm* — Wolf, Greenfield & Sacks, P.C.

(57) ABSTRACT

A packaging structure and a packaging method are provided. The packaging structure includes: a chip unit, where a first surface of the chip unit includes a sensing region; and an upper cover plate structure, where a first surface of the upper cover plate structure is provided with a groove structure, the first surface of the chip unit is attached with the first surface of the upper cover plate structure, the sensing region is located within a cavity surrounded by the groove structure and the first surface of the chip unit, the upper cover plate structure further includes a second surface opposite to the first surface, and an area of the second surface of the upper cover plate structure is less than an area of the first surface of the upper cover plate structure.

13 Claims, 7 Drawing Sheets

(52) U.S. Cl.
CPC .. *H01L 27/14634* (2013.01); *H01L 27/14685* (2013.01); *H01L 27/14687* (2013.01); *H01L 2224/056* (2013.01); *H01L 2224/05573* (2013.01); *H01L 2224/11* (2013.01); *H01L 2224/13124* (2013.01); *H01L 2224/94* (2013.01); *H01L 2924/16235* (2013.01)

(58) Field of Classification Search
CPC ....... H01L 2224/05548; H01L 2224/94; H01L 2224/16237; H01L 2224/131; H01L 2224/13024; H01L 2224/13022; H01L 2224/02372; H01L 2924/01029; H01L 27/14627; H01L 31/02325; H01L 21/76898; H01L 27/14687; H01L 31/0203; H01L 27/14632; H01L 27/14618; H01L 27/14683; H01L 24/05; H01L 24/13; H01L 2224/03; H01L 2224/11; H01L 2924/014; H01L 2224/05552; H01L 2924/00; H04N 5/2254

USPC ................ 257/433, 98; 438/66, 33; 348/335
See application file for complete search history.

(56) References Cited

U.S. PATENT DOCUMENTS

| | | |
|---|---|---|
| 2011/0122303 A1 | 5/2011 | Bonkohara |
| 2011/0147782 A1 | 6/2011 | Sano et al. |
| 2014/0197511 A1 | 7/2014 | Borthakur et al. |

FOREIGN PATENT DOCUMENTS

| | | |
|---|---|---|
| CN | 105097724 A | 11/2015 |
| CN | 205050824 U | 2/2016 |
| WO | WO 2008/081950 A1 | 7/2008 |

OTHER PUBLICATIONS

International Search Report for Application No. PCT/CN2016/093569 dated Nov. 3, 2016.
Written Opinion for Application No. PCT/CN2016/093569 dated Nov. 3, 2016.

PACKAGING STRUCTURE AND PACKAGING METHOD

This application is the national phase of International Application No. PCT/CN2016/093569, titled "PACKAGING STRUCTURE AND PACKAGING METHOD", filed on Aug. 5, 2016, which claims priority to Chinese Patent Application No. 201510496625.6, titled "PACKAGING STRUCTURE AND PACKAGING METHOD", filed with the Chinese State Intellectual Property Office on Aug. 13, 2015, and to Chinese Patent Application No. 201520608933.9, titled "PACKAGING STRUCTURE", filed with the Chinese State Intellectual Property Office on Aug. 13, 2015, both of which applications are incorporated herein by reference in their entireties.

FIELD

The present disclosure relates to the technical field of semiconductors, and in particular to a packaging structure and a packaging method.

BACKGROUND

In the conventional technology, an IC chip is connected with an external circuit by metal wire bonding. With reduction in feature sizes of IC chips and an expansion of scales of integrated circuits, the wire bonding technology is no longer suitable.

The wafer level chip size packaging (WLCSP) technology is a technology of packaging and testing a whole wafer and then cutting the whole wafer to acquire single finished chips, where the size of the packaged chip is the same as the size of a bare chip. The wafer level chip size packaging technology overturns the traditional packaging manners such as the ceramic leadless chip carrier packaging manner and the organic leadless chip carrier packaging manner, and meets market requirements for microelectronic products which are increasingly lighter, smaller, shorter, thinner and cheaper. A chip packaged with the wafer level chip size packaging technology is highly miniaturized, and the cost of the chip is greatly reduced with reduction of the size of the chip and an increase in the size of the wafer. The wafer level chip size packaging technology integrates IC design, wafer fabrication, and package test, and is a focus and a development trend of the current field of packaging.

An image sensor chip is capable of converting an optical image into an electronic signal, and includes a sensing region. In a case where the image sensor chip is packaged using the existing wafer level chip size packaging technology, an upper cover substrate is generally formed on the sensing region to protect the sensing region from being damaged or contaminated during a packaging process. The upper cover substrate may be retained after the wafer level chip size packaging for continuing protecting the sensing region from being damaged or contaminated during use of the image sensor chip.

SUMMARY

A packaging structure and a packaging method are provided according to the embodiments of the present disclosure.

A packaging structure is provided according to an embodiment of the present disclosure. The packaging structure includes: a chip unit, where a first surface of the chip unit includes a sensing region; and an upper cover plate structure, where a first surface of the upper cover plate structure is provided with a groove structure, where the first surface of the chip unit is attached with the first surface of the upper cover plate structure, the sensing region is located within a cavity surrounded by the groove structure and the first surface of the chip unit, the upper cover plate structure further includes a second surface opposite to the first surface, and an area of the second surface of the upper cover plate structure is less than an area of the first surface of the upper cover plate structure.

Optionally, the upper cover plate structure may further include a side wall including a vertical wall and an inclined wall, a first end of the inclined wall is connected to an edge of the second surface of the upper cover plate structure, and a second end opposite to the first end of the inclined wall is connected to the top of the vertical wall, such that the area of the second surface of the upper cover plate structure is less than the area of the first surface of the upper cover plate structure.

Optionally, an angle between the inclined wall and the vertical wall may range from 120° to 150°.

Optionally, a height difference between the top of the vertical wall and the second surface of the upper cover plate structure may be determined based on a thickness of the upper cover plate structure, a distance between an inner side wall of the groove structure and the vertical wall of the upper cover plate structure, and a refraction index of the upper cover plate structure.

Optionally, the height difference between the top of the vertical wall and the second surface of the upper cover plate structure may range from 1/5 to 4/5 of the thickness of the upper cover plate structure.

Optionally, the upper cover plate structure may be made of a transparent material.

Optionally, the upper cover plate structure may be made of inorganic glass or organic glass, and has a thickness ranging from 300 μm to 500 μm.

Optionally, the chip unit may further include: a contact pad located outside the sensing region; a through hole passing through the chip unit from a second surface of the chip unit opposite to the first surface of the chip unit, where the contact pad is exposed by the through hole; an insulation layer covering the second surface of the chip unit and a surface of a side wall of the through hole; a metal layer located on a surface of the insulation layer and electrically connected with the contact pad; a solder mask located on a surface of the metal layer and the surface of the insulation layer, where the solder mask is provided with an opening by which a portion of the metal layer is exposed; and a protrusion for external connection which is exposed outside a surface of the solder mask, where the opening is filled by the protrusion for external connection.

Corresponding to the above packaging structure, a packaging method is provided according to an embodiment of the present disclosure. The packaging method includes: providing a wafer to be packaged, where a first surface of the wafer to be packaged is provided with multiple chip units and sawing lane regions located between the chip units, and the chip units include sensing regions; providing a cover substrate, where multiple groove structures are formed on a first surface of the cover substrate, and the groove structures correspond to the sensing regions on the wafer to be packaged; attaching the first surface of the cover substrate with the first surface of the wafer to be packaged, where cavities are formed by the groove structures and the first surface of the wafer to be packaged, and the sensing regions are located within the cavities; cutting the wafer to be packaged and the cover substrate along the sawing lane regions, to form multiple chip package structures, where the chip package structure includes the chip unit and an upper cover plate structure which is located on the chip unit and formed by cutting the cover substrate, the upper cover plate structure includes a first surface on a side on which the chip unit is located and a second surface opposite to the first surface, and the cutting causes an area of the second surface of the upper cover plate structure to be less than an area of the first surface of the upper cover plate structure.

Optionally, the cutting the wafer to be packaged and the cover substrate along the sawing lane regions may include: performing a first cutting process, which includes cutting the wafer to be packaged along the sawing lane regions from a second surface of the wafer to be packaged opposite to the first surface of the wafer to be packaged until the first surface of the wafer to be packaged is reached, to form a first cutting groove; performing a second cutting process, which includes cutting the cover substrate along the sawing lane regions from a second surface of the cover substrate opposite to the first surface of the cover substrate until a predetermined depth is reached, to form a second cutting groove, where a width of the second cutting groove gradually decreases in a direction from the second surface of the cover substrate to the first surface of the cover substrate; and performing a third cutting process, which includes continuing cutting the cover substrate until a third cutting groove connecting the first cutting groove and the second cutting groove is formed, to simultaneously form multiple the chip package structures, where the upper cover plate structure further includes a side wall including a vertical wall and an inclined wall, a first end of the inclined wall is connected to an edge of the second surface of the cover substrate, and a second end opposite to the first end of the inclined wall is connected to the top of the vertical wall, such that an area of the second surface of the upper cover plate structure is less than an area of the first surface of the upper cover plate structure.

Optionally, the predetermined depth may be determined based on a thickness of the upper cover plate structure of the chip package structure, a distance between an inner side wall of the groove structure and a side wall of the upper cover plate structure, and a refraction index of the upper cover plate structure.

Optionally, the predetermined depth may range from 1/5 to 4/5 of the thickness of the cover substrate.

Optionally, a drill grinding process may be used in the second cutting process, to cause the second cutting groove formed by the second cutting process to have an inverted triangle cross section, an inverted trapezoid cross section, a circular arc cross section or a parabolic cross section.

Optionally, a drill grinding process may be used in the second cutting process.

Optionally, an angle between a side wall of the second cutting groove and the second surface of the cover substrate may range from 120° to 150°.

Optionally, the chip unit may further include a contact pad located outside the sensing region, and after attaching the first surface of the cover substrate with the first surface of the wafer to be packaged, the packaging method may further include: thinning the wafer to be packaged from a second surface of the wafer to be packaged opposite to the first surface of the wafer to be packaged; etching the wafer to be packaged from the second surface of the wafer to be packaged, to form a through hole by which the contact pad of the chip unit is exposed; forming an insulation layer on the second surface of the wafer to be packaged and a surface of a side wall of the through hole; forming a metal layer on a surface of the insulation layer, where the metal layer is connected with the contact pad; forming a solder mask on a surface of the metal layer and the surface of the insulation layer, where the solder mask is provided with an opening by which a portion of the surface of the metal layer is exposed; and forming a protrusion for external connection on a surface of the solder mask, where the opening is filled by the protrusion for external connection.

In the packaging structure according to the embodiment of the present disclosure, the area of the second surface of the upper cover plate structure is less than the area of the first surface of the upper cover plate structure. For example, the side wall of the upper cover plate structure includes the vertical wall and the inclined wall, where the first end of the inclined wall is connected to the edge of the second surface of the upper cover plate structure, and the second end opposite to the first end of the inclined wall is connected to the top of the vertical wall. As compared with the packaging structure in the conventional technology, the side wall structure including the inclined wall can prevent a light beam totally reflected by the side wall from entering the upper cover plate structure, thereby reducing interfering light beams which are reflected by the side wall of the upper cover plate structure and enter the sensing region, thus imaging quality of the chip package structure which serves as an image sensor can be increased.

Further, in the packaging structure according to the present disclosure, the height difference between the top of the vertical wall and the second surface of the upper cover plate structure is determined based on the thickness of the upper cover plate structure, the distance between the inner side wall of the groove structure and the side wall of the upper cover plate structure, and the refraction index of the upper cover plate structure, such that light beams totally reflected by the side wall of the upper cover plate structure can be incident on only a top surface of the cavity wall, and cannot be incident on the sensing region, thereby further reducing interfering light beams entering the sensing region.

Correspondingly, the packaging method according to the embodiment of the present disclosure also has the above advantages.

DETAILED DESCRIPTION OF THE EMBODIMENTS

The inventor of the present disclosure studies a process of packaging image sensor chips using the conventional wafer level chip size packaging technology, and finds that the image sensor chips formed using the conventional technology have poor performance, since an upper cover substrate formed above a sensing region during the chip packaging procedure disturbs light beams entering the sensing region, which reduces the imaging quality.

Figure 1:
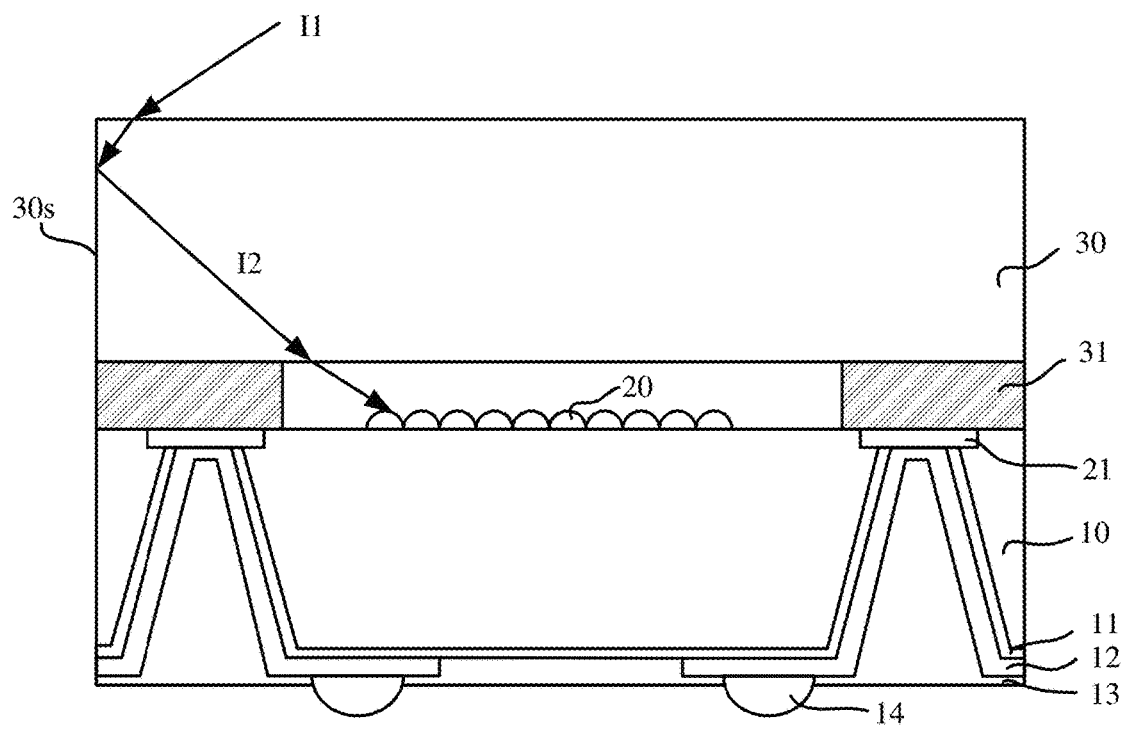
FIG. 1 shows a cross-sectional view illustrating a structure of an image sensor chip according to the conventional technology.

Specifically, reference is made to FIG. 1, which shows a cross-sectional view illustrating a structure of an image sensor chip formed using the conventional technology. The image sensor chip includes: a substrate 10; a sensing region 20 located on a first surface of the substrate 10; contact pads 21 located on the first surface of the substrate 10 on both sides of the sensing region 20; through holes (not indicated in FIG. 1) passing through the substrate 10 from a second surface opposite to the first surface of the substrate 10, where the contact pads 21 are exposed by the through holes; an insulation layer 11 located on side walls of the through holes and the second surface of the substrate 10; a wiring layer 12 covering the contact pads 21 and a portion of the insulation layer 11 from the second surface; a solder mask 13 covering the wiring layer 12 and the insulation layer 11, where the solder mask 13 includes openings; solder balls 14 which are located in the openings of the solder mask 13 and electrically connected with the contact pads 21 via the wiring layer 12; a cavity wall 31 located around the sensing region 20 and on the first surface of the substrate 10; and an upper cover substrate 30 located on the cavity wall. A cavity is formed by the upper cover substrate 30, the cavity wall 21, and the first surface of the substrate 10, such that the sensor 20 is located in the cavity, thereby preventing the sensing region 20 from being contaminated or damaged during packaging and use. The upper cover substrate 30 generally has a great thickness such as 400 μm.

The inventor of the present disclosure found that, during use of the above image sensor chip, when a light beam I1 is incident on the upper cover substrate 30 of the image sensor, a light beam I2, as a portion of the light beam I1 which enters the upper cover substrate 30, is incident on a side wall 30s of the upper cover substrate 30, which causes refraction and reflection of the light beam I2. If the reflected light beam is incident on the sensing region 20, imaging by the image sensor is disturbed. Specifically, in a case where an incident angle of the light beam I2 meets a certain condition, for example, in a case where the upper cover substrate 30 is made of glass and air is outside the glass, and the incident angle of the light beam I2 is greater than a critical angle at the glass to air interface, the light beam I2 is totally reflected by the side wall 30s of the upper cover substrate 30. The totally reflected light beam I2, which propagates within the upper cover substrate 30 and is incident on the sensing region 20, causes serious disturbance to the sensing region 20. In an imaging procedure of an image sensor, the disturbance results in a virtual image formed in a direction opposite to an optical path of the totally reflected light beam I2, which causes reduction in the imaging quality.

In addition, with the trend of miniaturization of the wafer level chip size package, an increasing number of sensor chip packages are integrated on a wafer level chip. A smaller size of single finished chip packages results in a smaller distance from the side wall of the upper cover substrate 30 to an edge of the sensing region 20. In this case, the above disturbance is more serious.

On the basis of the above study, a packaging method and a packaging structure formed using the packaging method are provided according to an embodiment of the present disclosure. The packaging method includes: providing a wafer to be packaged and a cover substrate, correspondingly attaching the cover substrate with the wafer to be packaged, where sensing regions on the wafer to be packaged are located in cavities surrounded by groove structures of the cover substrate and the wafer to be packaged, and then cutting the wafer to be packaged and the cover substrate along sawing lane regions on the wafer to be packaged to form single chip package structures. The chip package structure includes a chip unit and an upper cover plate structure located on the chip unit and formed by cutting the upper cover substrate. The above cutting process causes an area of a second surface of the upper cover plate structure away from the chip unit to be less than an area of a first surface of the upper cover plate structure close to the chip unit. The area of the second surface of the upper cover plate structure being less than the area of the first surface of the upper cover plate structure may be achieved by, for example, removing a corner constituted by the second surface and a side wall of the above upper cover plate structure, so that light beams which are incident from the second surface of the upper cover plate structure and are reflected by the side wall of the upper cover plate structure are reduced, and reflected light beam which enter the light sensing region is reduced, thus imaging quality of the chip package structure which serves as an image sensor can be improved. Correspondingly, the package structure formed using the above packaging method also has the above advantages.

To make the above object, features and advantages of the present disclosure more apparent and easier to be understood, particular embodiments of the disclosure are illustrated in detail in conjunction with the drawings hereinafter.

It should be noted that, the objective of providing the drawings is to help understanding embodiments of the present disclosure, and should not be construed to unduly limit the present disclosure. For the purpose of clarity, the dimensions in the drawings are not drawn to scale, and may be enlarged, reduced or changed in other manners.

A packaging method is provided according to an embodiment of the present disclosure. Reference is made to FIGS. 2 to 9, which are schematic structural diagrams illustrating a packaging process of an image sensor chip according to an embodiment of the present disclosure.

Figure 2:
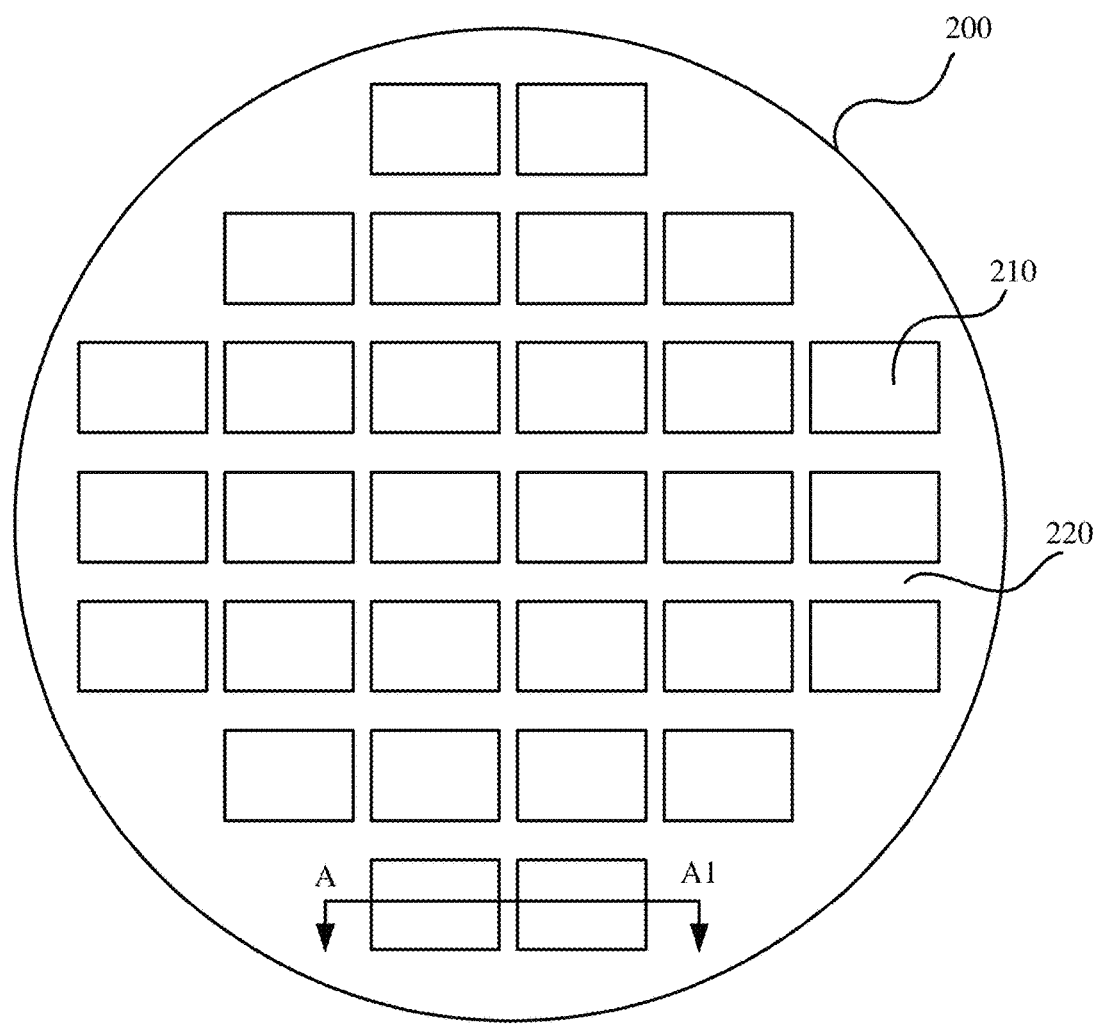
FIGS. 2 to 9 show schematic structural diagrams of intermediate structures formed using a packaging method according to an embodiment of the present disclosure.
Figure 3:
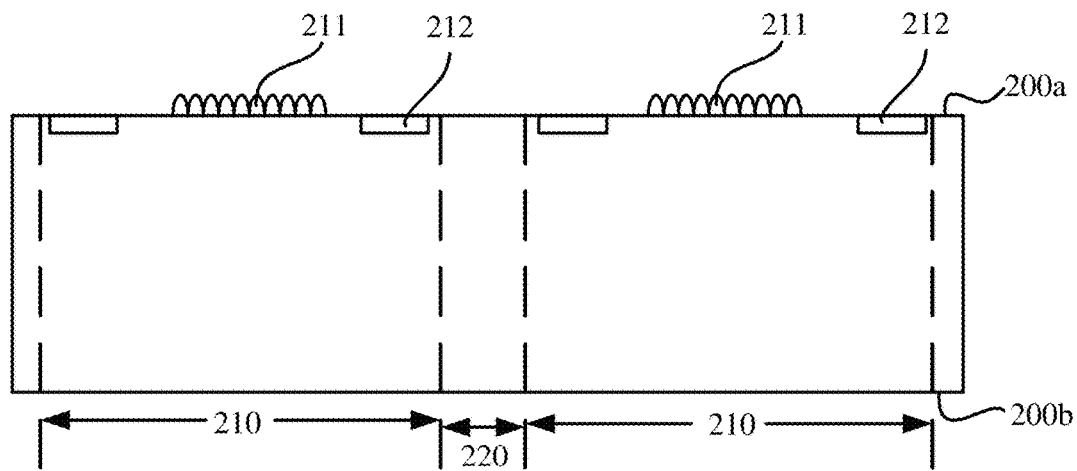

First, reference is made to FIGS. 2 and 3. A wafer to be packaged 200 is provided. FIG. 2 is a top view illustrating the structure of the wafer to be packaged 200, and FIG. 3 is a sectional view along AA1 in FIG. 2.

The wafer to be packaged 200 has a first surface 200a and a second surface 200b opposite to the first surface 200a. Multiple chip units 210 and sawing lane regions 220 located between the chip units 210 are provided on the first surface 200a of the wafer to be packaged 200.

In this embodiment, the multiple chip units 210 on the wafer to be packaged 200 are arranged in an array, and the sawing lane regions 220 are located between adjacent chip units 210. The wafer to be packaged 200 is cut along the sawing lane regions 220 in a subsequent process to form multiple chip package structures including the chip units 210.

In this embodiment, the chip unit 210 is an image sensor chip unit, and includes a sensing region 211 and a contact pad 212 located outside the sensing region 211. The sensing region 211 is an optical sensing region, which, for example, may be formed by multiple photodiodes arranged in an array. The photodiodes is capable of converting an optical signal incident on the sensing region 211 into an electrical signal. The contact pad 212 serves as an input terminal or an output terminal for connecting a component in the sensing region 211 to an external circuit. In some embodiments, the chip unit 210 is formed on a silicon substrate, and may further include other functional components formed in the silicon substrate.

It is to be noted that, in the following steps of the packaging method according to the embodiment of the present disclosure, for simplicity, only the sectional view along AA1 of the wafer to be packaged 200 shown in FIG. 2 is taken as an example for illustration. Similar processing steps are performed on other regions.

Figure 4:
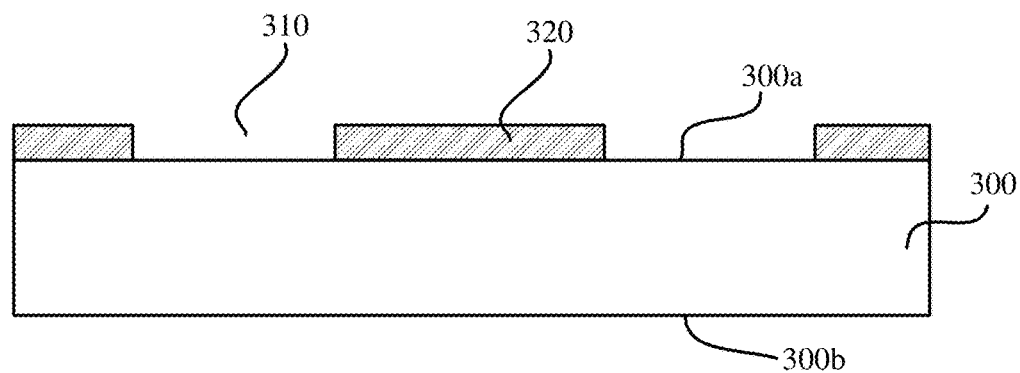

Then, reference is made to FIG. 4. A cover substrate 300 is provided. The cover substrate 300 includes a first surface 300a and a second surface 300b opposite to the first surface 300a. Multiple groove structures 310 are formed on the first surface 300a of the cover substrate 300, where the groove structures 310 correspond to the sensing regions 211 on the wafer to be packaged 200.

In this embodiment, the cover substrate 300 covers the first surface 200a of the wafer to be packaged 200 in subsequent processes to protect the sensing region 211 on the wafer to be packaged 200. Since light beams are to pass through the cover substrate 300 and reach the sensing region 211, the cover substrate 300 has a high transparency and is made of a transparent material. The two surfaces 300a and 300b of the cover substrate 300 are flat and smooth, and do not cause scattering or diffuse reflection of the incident light.

Optionally, the cover substrate 300 may be made of inorganic glass, organic glass or another transparent material with certain strength. In an embodiment of the present disclosure, a thickness of the cover substrate 300 ranges from 300 μm to 500 μm, and for example, may be 400 μm. In a case that the thickness of the cover substrate 300 is too great, a thickness of the formed chip package structure is too great and cannot meet the requirement for light and thin electronic products. In a case that the thickness of the cover substrate 300 is too small, a strength of the cover substrate 300 is reduced and the cover substrate 300 is prone to break, and cannot provide sufficient protection to the sensing region subsequently covered by the cover substrate 300.

In an embodiment of the present disclosure, multiple groove structures 310 are formed on the first surface 300a of the cover substrate 300. The groove structures 310 are surrounded by the first surface 300a of the cover substrate 300 and a cavity wall 320 located on the first surface 300a.

In this embodiment, the cavity wall 320 is formed by depositing a cavity wall material layer on the first surface 300a of the cover substrate 300, and then etching the cavity wall material layer. First, the cavity wall material layer (not shown) covering the first surface 300a of the cover substrate 300 is formed. Then the cavity wall material layer is patterned, and a portion of the cavity wall material layer is removed, to form the cavity wall 320. The cavity wall 320 and the first surface 300a of the cover substrate 300 surrounded by the cavity wall 320 form the groove structure 310. A position of the groove structure 310 on the cover substrate 300 corresponds to a position of the sensing region 211 on the wafer to be packaged 200, so that the sensing region 211 may be located in the groove structure 310 after a subsequent attachment process is performed. In some embodiments, the cavity wall material layer is made of wet film photoresist or dry film photoresist, and is formed by a spraying process, a spin coating process, an adhesion process or the like. The cavity wall 320 is formed by patterning the cavity wall material layer through exposure and development. In some embodiments, the cavity wall material layer may further be formed with an insulating dielectric material such as silicon oxide, silicon nitride, and silicon oxynitride, by a deposition process, and is subsequently patterned using a photolithographic process and an etching process to form the cavity wall 320.

In some other embodiments, the cavity wall 320 may also be formed by etching the cover substrate 300. Specifically, a patterned photoresist layer may be formed on the cover substrate 300. Then, the cover substrate 300 is etched with the patterned photoresist layer as a mask, to form the groove structure 310 in the cover substrate 300. The cavity wall 320 is a raised portion on the first surface 300a of the cover substrate 320.

Figure 5:
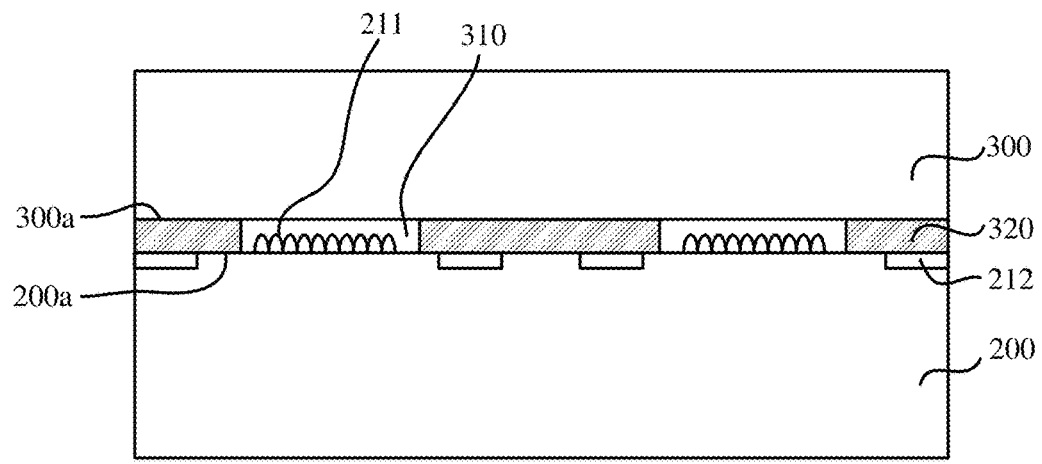

Next, reference is made to FIG. 5. The first surface 300a of the cover substrate 300 is attached with the first surface 200a of the wafer to be packaged 200, so that a cavity (not indicated) is formed by the groove structure 310 and the first surface 200a of the wafer to be packaged 200, and the sensing region 211 is located in the cavity.

In this embodiment, the cover substrate 300 is attached with the wafer to be packaged 200 through an adhesive layer (not shown). For example, the adhesive layer may be formed on a top surface of the cavity wall 320 on the first surface 300a of the cover substrate 300, and/or on the first surface 200a of the wafer to be packaged 200 by a spraying process, a spin coating process, or an adhesion process. Then, the first surface 300a of the cover substrate 300 is attached with the first surface 200a of the wafer to be packaged 200 through the adhesive layer. The adhesive layer performs an adhesive function, an insulation function and a sealing function. The adhesive layer may be made of a polymeric adhesive material, such as silica gel, epoxy resin, benzocyclobutene and other polymeric materials.

In this embodiment, after the first surface 300a of the cover substrate 300 is attached with the first surface 200a of the wafer to be packaged 200, the groove structure 310 and the first surface 200a of the wafer to be packaged 200 form the cavity. A position of the cavity corresponds to a position of the sensing region 211, and an area of the cavity is slightly greater than an area of the sensing region 211, so that the sensing region 211 is located in the cavity. In this embodiment, after the cover substrate 300 is attached with the wafer to be packaged 200, the contact pad 212 on the wafer to be packaged 200 is covered by the cavity wall 320 on the cover substrate 300. The cover substrate 300 can protect the wafer to be packaged 200 in subsequent processes.

Figure 6:
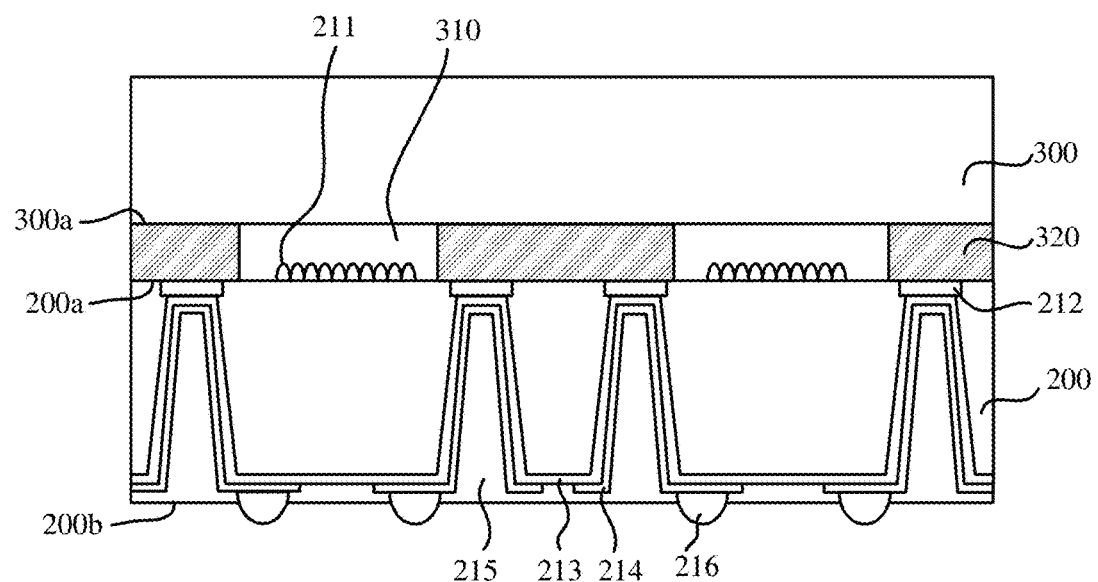

Next, reference is made to FIG. 6. The wafer to be packaged 200 is packaged.

First, the wafer to be packaged 200 is thinned from the second surface 200b of the wafer to be packaged 200 to facilitate subsequent etching for forming the through hole. The wafer to be packaged 200 may be thinned by a mechanical polishing process, a chemical mechanical polishing process or the like. Then, the wafer to be packaged 200 is etched from the second surface 200b of the wafer to be packaged 200 to form a through hole (not indicated), where the contact pad 212 on a side of the first surface 200a of the wafer to be packaged 200 is exposed by the through hole. Next, an insulation layer 213 is formed on the second surface 200b of the wafer to be packaged 200 and a side wall of the through hole, where the contact pad 212 at the bottom of the through hole is exposed by the insulation layer 213. The insulation layer 213 can provide electrical insulation for the second surface 200b of the wafer to be packaged 200, and can provide electrical insulation for a substrate of the wafer to be packaged 200 exposed by the through hole. A material of the insulation layer 213 may be silicon oxide, silicon nitride, silicon oxynitride or insulating resin. Then, a metal layer 214 connected with the contact pad 212 is formed on a surface of the insulation layer 213. The metal layer 214 may be used as a redistribution layer with which the contact pad 212 is extended to the second surface 200b of the wafer to be packaged 200 for connection to an external circuit. The metal layer 214 is formed by depositing and etching a metal thin film. Next, a solder mask 215 with an opening (not indicated) is formed on a surface of the metal layer 214 and the surface of the insulation layer 213, where a portion of the surface of the metal layer 214 is exposed by the opening. A material of the solder mask 215 is an insulating dielectric material such as silicon oxide and silicon nitride. The solder mask 215 functions to protect the metal layer 214. Then, a protrusion for external connection 216 is formed on a surface of the solder mask 215, where the opening is filled by the protrusion for external connection 216. The protrusion for external connection 216 may be a connection structure as a solder ball and a metal pillar, and may be made of a metal material such as copper, aluminum, gold, tin, and lead.

After the wafer to be packaged 200 is packaged, the chip package structure obtained by a subsequent cutting process can be connected with an external circuit through the protrusion for external connection 216. After an optical signal is converted by the sensing region 211 of the chip unit into an electrical signal, the electrical signal sequentially passes through the contact pad 212, the metal layer 214 and the protrusion for external connection 216 and is transmitted to the external circuit for processing.

Figure 7:
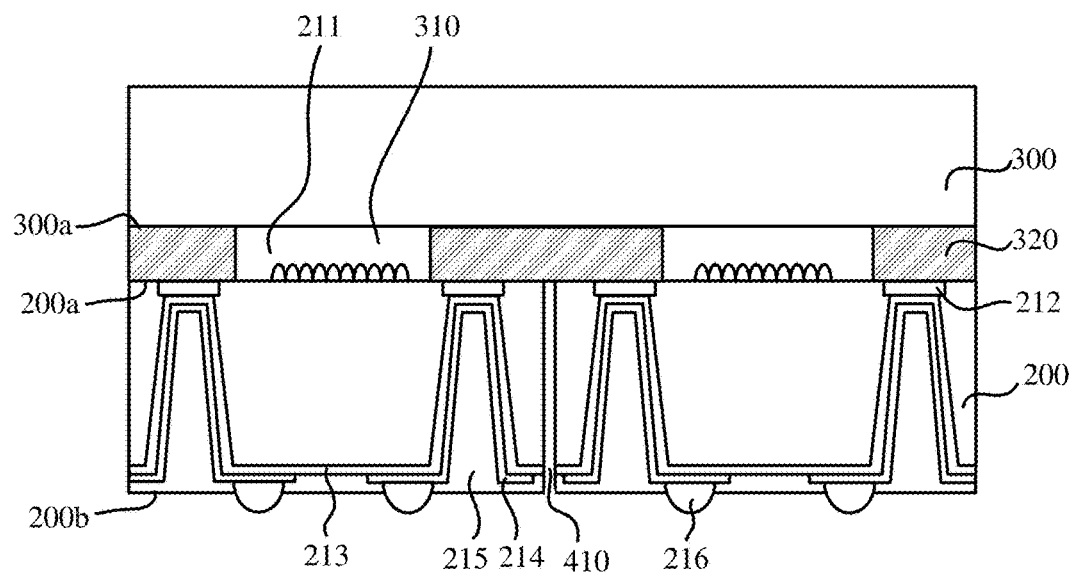
Figure 8:
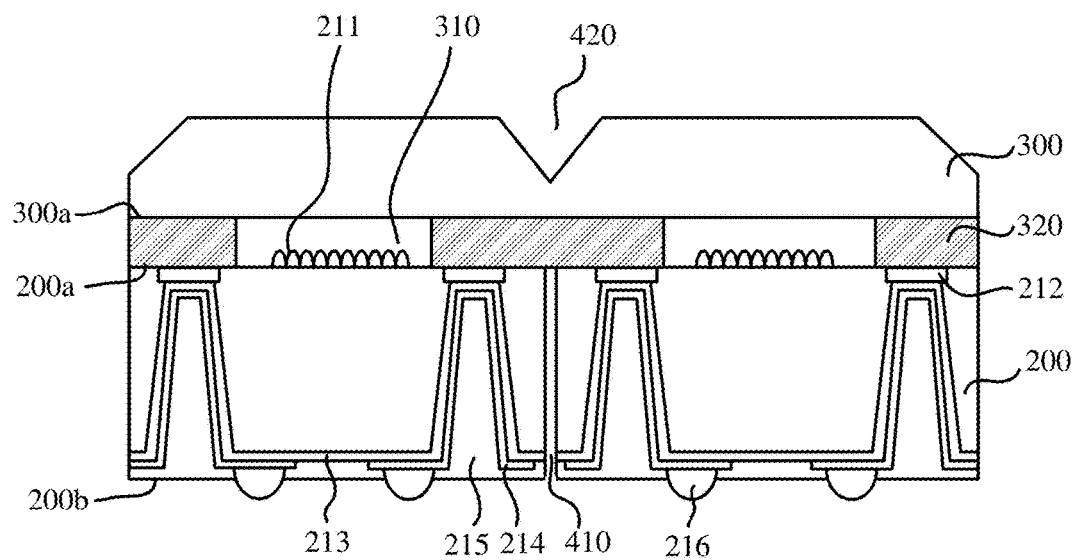
Figure 9:
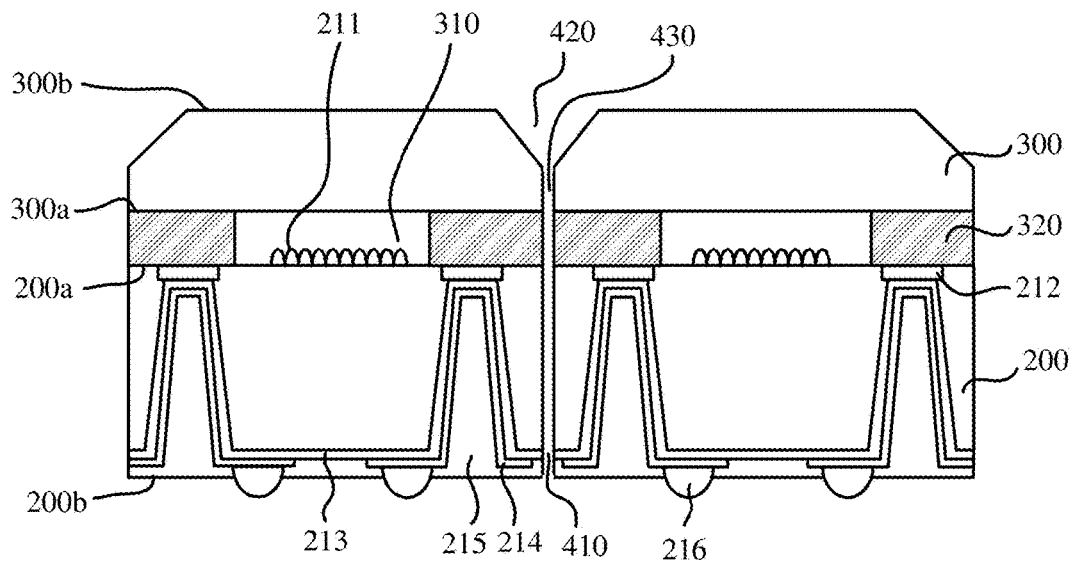
Figure 10:
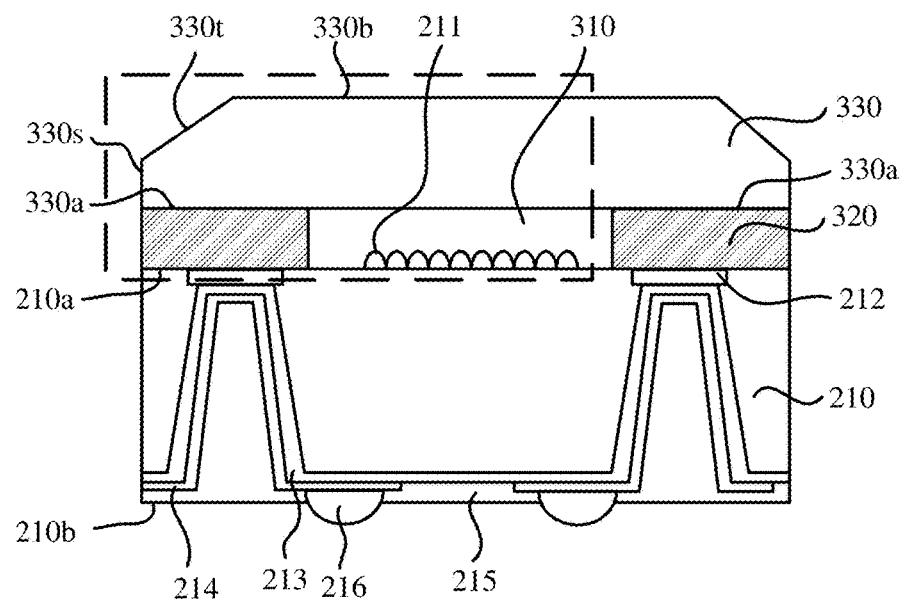
FIG. 10 shows a cross-sectional view of a packaging structure according to an embodiment of the present disclosure.

Next, reference is made to FIGS. 7 to 9, the wafer to be packaged 200 and the cover substrate 300 are cut along the sawing lane regions 220 (referring to FIG. 3) of the wafer to be packaged 200, to form multiple chip package structures as shown in FIG. 10. Reference is made to FIG. 10, the chip package structure includes the chip unit 210 and an upper cover plate structure 330 located on the chip unit 210 and formed by cutting the cover substrate 300. The upper cover plate structure 330 includes a first surface 330a on a side on which the chip unit 210 is located and a second surface 330b opposite to the first surface 330a, where an area of the second surface 330b of the upper cover plate structure 330 is less than an area of the first surface 330a of the upper cover plate structure 330 due to the above cutting.

In this embodiment, the cutting performed on the wafer to be packaged 200 and the cover substrate 300 includes a first cutting process, a second cutting process and a third cutting process. Specifically, as shown in FIG. 7, first, the first cutting process is performed, where the wafer to be packaged 200 is cut along the sawing lane region 220 shown in FIG. 3 from the second surface 200b of the wafer to be packaged 200 until the first surface 200a of the wafer to be packaged 200 is reached to form a first cutting groove 410. Slicing knife cutting or laser cutting may be used in the first cutting process, where the slicing knife cutting may be performed using a metal knife or a resin knife.

Then, referring to FIG. 8, the second cutting process is performed, where the cover substrate 300 is cut along a region corresponding to the sawing lane region 220 shown in FIG. 3 from the second surface 300b of the cover substrate 300 until a predetermined depth is reached, to form a second cutting groove 420. The width of the second cutting groove 420 gradually decreases in a direction from the second surface 300b of the cover substrate 300 to the first surface 300a of the cover substrate 300. In some embodiments, a drill grinding process is used in the second cutting process. In the drill grinding process, a drill in a certain shape which is pressurized is rotated and moved on the second surface 300b of the cover substrate 300 for grinding, thereby forming the second cutting groove 420. A top width of the drill is less than a bottom width of the drill, so that the width of the formed second cutting groove 420 gradually decreases from the second surface 300b of the cover substrate 300 to the first surface 300a of the cover substrate 300. Based on the shape of the drill, the second cutting groove 420 may have an inverted triangle cross section, an inverted trapezoid cross section, a circular arc cross section or a parabolic cross section. An angle between a side wall of the second cutting groove 420 and the second surface 300b of the cover substrate 300 ranges from 120° to 150°. In this embodiment, the angle between the side wall of the second cutting groove 420 and the second surface 300b of the cover substrate 300 is 135°. The predetermined depth of the second cutting groove 420 ranges from ⅕ to ⅘ of the thickness of cover substrate 300. For example, in this embodiment, the predetermined depth of the second cutting groove 420 is ½ of the thickness of the cover substrate 300.

Next, referring to FIG. 9, the third cutting process is performed. In some embodiments, the third cutting process is performed by continuing cutting the cover substrate 300 along the second cutting groove 420 until the first surface 200a of the wafer to be packaged 200 is reached, thereby forming a third cutting groove 430. The third cutting groove 430 connects the second cutting groove 420 with the first cutting groove 410, by which the whole cutting process is completed, and multiple chip package structures are formed. The slicing knife cutting or the laser cutting may also be used in the third cutting process. It should be noted that, a width of the third cutting groove 430 formed by the third cutting process should be less than an average width of the second cutting groove 420.

In some other embodiments, the third cutting process may also be performed by continuing cutting the cover substrate 300 along the first cutting groove 410 until forming a third cutting groove 430 which connects the first groove 410 with the second groove 420.

After the above cutting processes, the chip package structure shown in FIG. 10 is formed. Hereinafter, an operation procedure of the chip package structure shown in FIG. 10 is described in conjunction with FIG. 11, which is a partially enlarged view of the portion in the dashed box in FIG. 10. The area of the second surface 330b of the upper cover plate structure 330 is less than the area of the first surface 330a of the upper cover plate structure 330 due to the above cutting processes. Specifically, in this embodiment, a corner constituted by the second surface 330b and a side wall of the upper cover plate structure 330 is removed, so that a side wall of the formed chip package structure includes a vertical wall 330s and an inclined wall 330t. A first end of the inclined wall 330t is connected to an edge of the second surface 330b of the upper cover plate structure 330, and a second end opposite to the first end of the inclined wall 330t is connected to the top of the vertical wall 330s. As compared with the image sensor formed by the conventional technology shown in FIG. 1, for the same incident light beam I1, in FIG. 1, the light beam I1 is totally reflected by the side wall 30s of the image sensor, and interferes with imaging of the sensing region 20. However, referring to FIG. 11, in the chip package structure according to an embodiment of the present disclosure, since the corner constituted by the second surface 330b and the vertical wall 330s of the upper cover plate structure 330 is removed, the light beam I1 is prevented from being incident on the upper cover plate 330, and does not cause interference to the sensing region 211.

Figure 11:
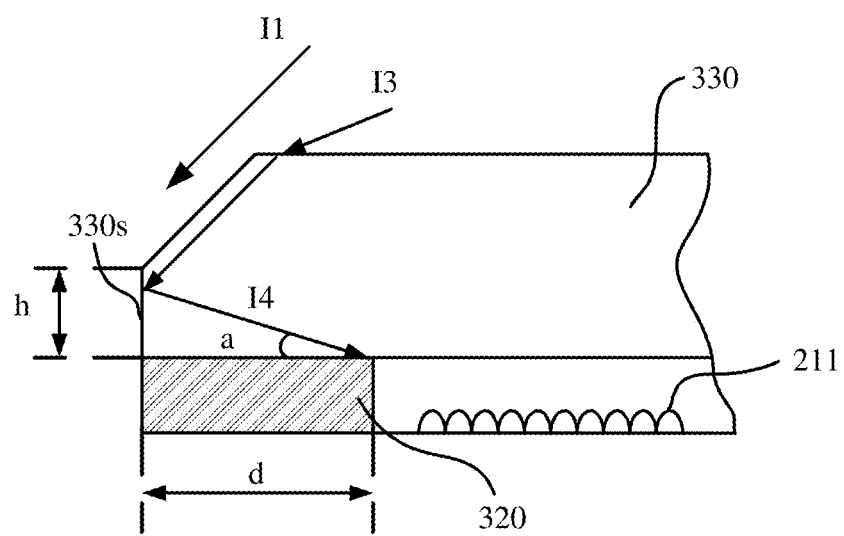
FIG. 11 shows a partially enlarged view of the packaging structure shown in FIG. 10.

It should be noted that, the corner between the inclined wall 330t and the vertical wall 330s in the upper cover plate structure 330 is formed in the above second cutting process, and a shape of the corner depends on the shape of the second cutting groove 420 (referring to FIG. 9). Reference is made to FIG. 11, in some embodiments, the predetermined depth of the above second cutting groove 420 is determined based on a thickness of the upper cover plate structure 330 in the chip package structure, a distance d between an inner side wall of the groove structure (namely, a side wall of the cavity wall 320 which is close to the sensing region 211 in this embodiment) and the side wall 330s of the upper cover plate structure 330, and a refraction index of the upper cover plate structure 330.

Specifically, a critical angle for total reflection at the side wall 330 of the light beam incident on the upper cover plate structure 330 is determined based on the refraction index of the upper cover plate structure 330 and a refraction index of air or other mediums outside the upper cover plate structure 330. Still referring to FIG. 11, in this embodiment, it is assumed that the critical angle is $\alpha$, the distance between the side wall of the cavity wall 320 which is close to the sensing region 211 and the side wall 330s of the upper cover plate structure 330 is d, and the side wall 330s of the upper cover plate structure 330 is perpendicular to the top surface of the cavity wall 320. When a light beam I3 is incident on the upper cover plate structure 330, and a portion of the light beam I3 is incident on the side wall 330s at an angle $\alpha$, an angle between the reflected light beam I4 and the top surface of the cavity wall 320 is also $\alpha$. A height $h=\tan(\alpha)*d$ can be determined based on a trigonometric function. The height h ensures that, when the light beam I3 which is prone to total reflection is incident on the vertical wall 330s at a height below h, the reflected light beam I4 can only be incident on the top surface of the cavity wall 320 and cannot be incident on the sensing region 211 even in the case of total reflection, thus the reflected light beam I4 does not interfere with imaging of the sensing region 211. Therefore, the predetermined depth of the second cutting groove 420 in this embodiment is set to be greater than the difference between the upper cover plate structure 320 and the height h, so that the light beam which is totally reflected by the side wall of the upper cover plate structure 330 does not enter the sensing region 211.

In some other embodiments, the depth of the second cutting groove 420 is determined in an additional consideration of factors such as a distance between the sensing region 211 and the inner side wall of the cavity wall 320, a thickness of the cavity wall 320, and a width of the third cutting groove 430 formed with the third cutting process. In summary, the shape of the second cutting groove 420 ensures that, the light beam totally reflected by the side wall of the upper cover plate structure 330 do not enter the sensing region 211 in the chip package structure.

Corresponding to the chip package structure formed using the above packaging method, a packaging structure is further provided according to an embodiment of the present disclosure.

Referring to FIG. 10, the packaging structure includes: a chip unit 210, where a first surface 210a of the chip unit 210 is provided with a sensing region 211; and an upper cover plate structure 330. A first surface 330a of the upper cover plate structure 330 is provided with multiple groove structures 310 formed by the first surface 330a of the upper cover plate structure 330 and a cavity wall 320 on the first surface 330a. The first surface 210a of the chip unit 210 is attached with the first surface 330a of the upper cover plate structure 330, so that the sensing region 211 is located in a cavity surrounded by the groove structure 310 and the first surface 330a of the chip unit 330. The upper cover plate structure 330 further includes a second surface 330b opposite to the first surface 330a, and an area of the second surface 330b of the upper cover plate structure 330 is less than an area of the first surface 330a of the upper cover plate structure 330.

In this embodiment, the upper cover plate structure 330 further includes a side wall located between the first surface 330a and the second surface 330b, where the side wall includes a vertical wall 330s and an inclined wall 330t. A first end of the inclined wall 330t is connected to an edge of the second surface 330b of the upper cover plate structure 330, and a second end opposite to the first end of the inclined wall 330t is connected to the top of the vertical wall 330s. The inclined wall 330t may be formed by removing a corner constituted by the second surface 330b of the upper cover plate structure 330 and the side wall. Since the corner constituted by the second surface 330b of the upper cover plate structure 330 and the side wall is removed, total reflection of a light beam by the side wall constituting the corner before the corner is removed is avoided, and this light beam cannot enter the upper cover plate structure 330 anymore, thereby reducing interfering light beams which are reflected by the side wall of the upper cover plate structure and enter the sensing region, thus imaging quality of the chip package structure which serves as an image sensor can be improved.

In an embodiment of the present disclosure, an angle between the inclined wall 330t and the vertical wall 330s ranges from 120° to 150°, and the inclined wall 330t may be a plane, an arc surface, or a paraboloidal surface. For example, in a specific embodiment, the inclined wall 330t is a plane, and the angle between the inclined wall 330t and the vertical wall 330s is 135°.

In some embodiments, a height difference between the top of the vertical wall 330s and the second surface 330b of the upper cover plate structure 330 is determined based on a thickness of the upper cover plate structure 330, a distance between an inner side wall of the cavity wall 320 and the side wall of the upper cover plate structure 330, and a refraction index of the upper cover plate structure 330. A height of the removed corner is determined using the above method, so that the light beam totally reflected by the side wall of the upper cover plate structure is incident on only a top surface of the cavity wall, and is not incident on the sensing region, thereby further reducing the interfering light beams entering the sensing region. In some embodiments, the height difference between the top of the vertical wall 330s and the second surface 330b of the upper cover plate structure 330 ranges from 1/5 to 4/5 of the thickness of the upper cover plate structure 330, and may be 1/2 of the thickness of the upper cover plate structure 330, for example.

In some embodiments, the upper cover plate structure 330 is made of a transparent material, and the thickness of the upper cover plate structure ranges from 300 µm to 500 µm. Specifically, for example, the upper cover plate structure 330 is made of inorganic glass or organic glass, and has a thickness of 400 µm.

In this embodiment, the chip unit 210 further includes: a contact pad 212 located outside the sensing region 211; a through hole (not indicated) passing through the chip unit 210 from a second surface 210b opposite to the first surface 210a of the chip unit 210, where the contact pad 212 is exposed by the through hole; an insulation layer 213 covering the second surface 210b of the chip unit 210 and a surface of a side wall of the through hole; a metal layer 214 located at a surface of the insulation layer 213 and electrically connected with the contact pad 212; a solder mask 215 located on a surface of the metal layer 214 and the surface of the insulation layer 213, where the solder mask 215 includes an opening by which a portion of the metal layer 214 is exposed; and an protrusion for external connection 216 which is exposed outside a surface of the solder mask 215, where the opening is filled by the protrusion for external connection 216.

One can refer to the description of the above packaging method for description of the packaging structure, which is not described here.

The present disclosure is disclosed above, but is not limited thereto. Various alternations and modifications can be made to the technical solutions of the present disclosure by those skilled in the art without deviation from the spirit and scope of the present disclosure. Therefore, the scope of protection of the present disclosure is defined by the appended claims.

The invention claimed is:

1. A packaging structure, comprising:
a chip unit, wherein a first surface of the chip unit comprises a sensing region; and
an upper cover plate structure,
wherein a first surface of the upper cover plate structure is provided with a groove structure, the first surface of the chip unit is attached with the first surface of the upper cover plate structure, the sensing region is located within a cavity surrounded by the groove structure and the first surface of the chip unit,
wherein the upper cover plate structure further comprises a second surface opposite to the first surface, and an area of the second surface of the upper cover plate structure is less than an area of the first surface of the upper cover plate structure;
wherein the upper cover plate structure further comprises a side wall comprising a vertical wall and an inclined wall, a first end of the inclined wall is connected to an edge of the second surface of the upper cover plate structure, and a second end opposite to the first end of the inclined wall is connected to the top of the vertical wall, such that the area of the second surface of the upper cover plate structure is less than the area of the first surface of the upper cover plate structure.

2. The packaging structure according to claim 1, wherein an angle between the inclined wall and the vertical wall ranges from 120° to 150°.

3. The packaging structure according to claim 1, wherein a height difference between the top of the vertical wall and the second surface of the upper cover plate structure is determined based on a thickness of the upper cover plate structure, a distance between an inner side wall of the groove structure and the vertical wall of the upper cover plate structure, and a refraction index of the upper cover plate structure.

4. The packaging structure according to claim 3, wherein the height difference between the top of the vertical wall and the second surface of the upper cover plate structure ranges from 1/5 to 4/5 of the thickness of the upper cover plate structure.

5. The packaging structure according to claim 1, wherein the upper cover plate structure is made of a transparent material.

6. The packaging structure according to claim 5, wherein the upper cover plate structure is made of inorganic glass or organic glass, and has a thickness ranging from 300 μm to 500 μm.

7. The packaging structure according to claim 1, wherein the chip unit further comprises:
a contact pad located outside the sensing region;
a through hole passing through the chip unit from a second surface of the chip unit opposite to the first surface of the chip unit, wherein the contact pad is exposed by the through hole;
an insulation layer covering the second surface of the chip unit and a surface of a side wall of the through hole;
a metal layer located on a surface of the insulation layer and electrically connected with the contact pad;
a solder mask located on a surface of the metal layer and the surface of the insulation layer, wherein the solder mask is provided with an opening by which a portion of the metal layer is exposed; and
a protrusion for external connection which is exposed outside a surface of the solder mask, wherein the opening is filled by the protrusion for external connection.

8. A packaging method, comprising:
providing a wafer to be packaged, wherein a first surface of the wafer to be packaged is provided with a plurality of chip units and sawing lane regions located between the chip units, and the chip units comprise sensing regions;
providing a cover substrate, wherein a plurality of groove structures are formed on a first surface of the cover substrate, and the groove structures correspond to the sensing regions on the wafer to be packaged;
attaching the first surface of the cover substrate with the first surface of the wafer to be packaged, wherein cavities are formed by the groove structures and the first surface of the wafer to be packaged, and the sensing regions are located within the cavities; and
cutting the wafer to be packaged and the cover substrate along the sawing lane regions, to form a plurality of chip package structures, wherein the chip package structure comprises the chip unit and an upper cover plate structure which is located on the chip unit and formed by cutting the cover substrate, the upper cover plate structure comprises a first surface on a side on which the chip unit is located and a second surface opposite to the first surface, and the cutting causes an area of the second surface of the upper cover plate structure to be less than an area of the first surface of the upper cover plate structure;
wherein the cutting the wafer to be packaged and the cover substrate along the sawing lane regions comprises:
performing a first cutting process, which comprises cutting the wafer to be packaged along the sawing lane regions from a second surface of the wafer to be packaged opposite to the first surface of the wafer to be packaged until the first surface of the wafer to be packaged is reached, to form a first cutting groove;
performing a second cutting process, which comprises cutting the cover substrate along the sawing lane regions from a second surface of the cover substrate opposite to the first surface of the cover substrate until a predetermined depth is reached, to form a second cutting groove, wherein a width of the second cutting groove gradually decreases in a direction from the second surface of the cover substrate to the first surface of the cover substrate; and
performing a third cutting process, which comprises continuing cutting the cover substrate until a third cutting groove connecting the first cutting groove and the second cutting groove is formed, to simultaneously form a plurality of the chip package structures, wherein the upper cover plate structure further comprises a side wall comprising a vertical wall and an inclined wall, a first end of the inclined wall is connected to an edge of the second surface of the cover substrate, and a second end opposite to the first end of the inclined wall is connected to the top of the vertical wall, such that an area of the second surface of the upper cover plate structure is less than an area of the first surface of the upper cover plate structure.

9. The packaging method according to claim 8, wherein the predetermined depth is determined based on a thickness of the upper cover plate structure of the chip package structure, a distance between an inner side wall of the groove structure and a side wall of the upper cover plate structure, and a refraction index of the upper cover plate structure.

10. The packaging method according to claim 9, wherein the predetermined depth ranges from 1/5 to 4/5 of the thickness of the cover substrate.

11. The packaging method according to claim 8, wherein a drill grinding process is used in the second cutting process, to cause the second cutting groove formed by the second cutting process to have an inverted triangle cross section, an inverted trapezoid cross section, a circular arc cross section or a parabolic cross section.

12. The packaging method according to claim 11, wherein an angle between a side wall of the second cutting groove and the second surface of the cover substrate ranges from 120° to 150°.

13. The packaging method according to claim 8, wherein the chip unit further comprises a contact pad located outside the sensing region, and after attaching the first surface of the cover substrate with the first surface of the wafer to be packaged, the packaging method further comprises:
  thinning the wafer to be packaged from a second surface of the wafer to be packaged opposite to the first surface of the wafer to be packaged;
  etching the wafer to be packaged from the second surface of the wafer to be packaged, to form a through hole by which the contact pad of the chip unit is exposed;
  forming an insulation layer on the second surface of the wafer to be packaged and a surface of a side wall of the through hole;
  forming a metal layer on a surface of the insulation layer, wherein the metal layer is connected with the contact pad;
  forming a solder mask on a surface of the metal layer and the surface of the insulation layer, wherein the solder mask is provided with an opening by which a portion of the surface of the metal layer is exposed; and
  forming a protrusion for external connection on a surface of the solder mask, wherein the opening is filled by the protrusion for external connection.

* * * * *